(12) United States Patent (10) Patent No.: US 11,508,931 B2
Hopkin (45) Date of Patent: Nov. 22, 2022

(54) ULTRATHIN METAL INTERLAYER FOR IMPROVED INJECTION INTO ELECTRON TRANSPORT LAYER

(71) Applicant: SHARP KABUSHIKI KAISHA, Sakai (JP)

(72) Inventor: Hywel Hopkin, Oxford (GB)

(73) Assignee: SHARP KABUSHIKI KAISHA, Sakai (JP)

( * ) Notice: Subject to any disclaimer, the term of this patent is extended or adjusted under 35 U.S.C. 154(b) by 187 days.

(21) Appl. No.: 17/105,600

(22) Filed: Nov. 26, 2020

(65) Prior Publication Data

US 2022/0165981 A1 May 26, 2022

(51) Int. Cl.
*H01L 51/52* (2006.01)
*H01L 51/50* (2006.01)

(52) U.S. Cl.
CPC ...... *H01L 51/5234* (2013.01); *H01L 51/5004* (2013.01); *H01L 51/5072* (2013.01); *H01L 51/5215* (2013.01); *H01L 51/502* (2013.01); *H01L 51/5212* (2013.01); *H01L 51/5228* (2013.01); *H01L 2251/5369* (2013.01); *H01L 2251/558* (2013.01)

(58) Field of Classification Search
CPC ............ H01L 51/5234; H01L 51/5004; H01L 51/5215
See application file for complete search history.

(56) References Cited

U.S. PATENT DOCUMENTS 6,812,637 B2  11/2004  Cok et al.

OTHER PUBLICATIONS

U.S. Appl. No. 16/689,383 by Boardman et al., Sharp Laboratories of Europe, filed Nov. 20, 2019.
Bi et al. "Ultrathin Metal Films as the Transparent Electrode in ITO-Free Organic Optoelectronic Devices" Advanced Optical Materials, 2018, 1800778 doi:10.1002/adom.201800778.

*Primary Examiner* — Anthony Ho
(74) *Attorney, Agent, or Firm* — ScienBiziP, P.C.

(57) ABSTRACT

A light-emitting device includes a first electrode, an electron transport layer (ETL), a second electrode being a transparent conductive electrode (TCE) including electrically conductive nanoparticles; an emissive layer (EML) in electrical contact with the first electrode and the second electrode; and an ultrathin metal layer between the TCE and the ETL, wherein the ultrathin metal layer provides an energy step between the TCE and the ETL.

20 Claims, 6 Drawing Sheets

ULTRATHIN METAL INTERLAYER FOR IMPROVED INJECTION INTO ELECTRON TRANSPORT LAYER

FIELD

The present disclosure is related to a Quantum Dot (QD) Light Emitting Diode (QLED) device comprising an ultrathin metal layer located between a transparent conductive electrode (TCE) and an electron transport layer (ETL) that improves charge injection into the ETL with minimal loss in transparency.

BACKGROUND

A basic QLED device includes at least an electroluminescent QD (emissive) layer (EML) between an anode and a cathode. The basic QLED may also include an ETL between the cathode and the EML and a hole transport layer (HTL) between the EML and the anode. The basic QLED may further include an electron injection layer (EIL) between the cathode and the ETL and a hole injection layer (HIL) between the HTL and anode. The layers of the basic QLED may be deposited on a substrate. The substrate may be transparent and formed of a rigid or flexible material. The substrate may have a thin film transistor (TFT) structure which drives the QLED.

A QLED device is said to be bottom emitting (BE) if light is emitted through the substrate on which the layers are deposited. A QLED device is said to be top emitting (TE) if the light is emitted away from the substrate.

A TE device may be considered a preferable structure compared to a BE device since, if the substrate has a TFT structure, a significant reduction in brightness results. A QLED device may have a "standard" structure in which the anode is in contact with the TFT substrate. A QLED device may have an "inverted" structure in which the cathode is in contact with the TFT substrate.

QLED devices in related art use a semi-transparent thin metal layer, such as Ag/Mg alloy with a thickness of around 15 nanometers (nm) as disclosed in U.S. Pat. No. 6,812,637 B2. This type of device requires a trade-off between optical transparency and electrical conductivity in that the metal layer cannot be much thinner than 15 nm or the conductivity is too low and the metal layer cannot be much thicker than 15 nm or the transparency is too low. A compromise in metal layer thickness provides a related art QLED having transparency of 50-60% ("semi-transparent") with adequate conductivity to transport current across a mobile phone-sized display of ≤6". For larger displays, such a related art QLED has too large a voltage drop leading to poor brightness uniformity across the display. For the purpose of the present disclosure, "transparent" refers to a device with higher transparency (>60%) than is achieved in related art devices. Semi-transparent devices lead to cavity effects which result in in poor colour shift at wide viewing angles. It is, therefore, desirable for a QLED device to have a transparent electrode.

In order to achieve a QLED technology that can be applicable in larger display sizes, an auxiliary wire grid electrode can be used to transport current to each of the pixels of the display. A TCE can spread the current across each pixel. The related art device as illustrated in U.S. patent application Ser. No. 16/689,383 is one in which the TCE is a transparent nanoparticle layer, such as indium tin oxide nanoparticles (ITO NPs). ITO NPs can have a transparency of >95% and the auxiliary wire grid electrode can be relatively thick to enable good conductivity across the display. The use of a NP electrode may also provide protection to the ETL layer which can be damaged by the wet etch process used to form the wire grid electrode.

FIG. 1 illustrates a related art QD-LED 100 and possible materials for each element. The QD-LED includes a bottom reflector 102, an anode 103, an HIL 106, an HTL 109, an EML 105, an ETL 107, a TCE 104 including a conductive nanoparticle layer in combination with a wire grid auxiliary electrode 108. The wire grid auxiliary electrode 108, which is deposited above banks (not explicitly shown) between the pixels, transports current to each pixel of a display. The conductive nanoparticle layer of the ICE 104 spreads the current across the pixel. The conductive nanoparticle layer of the TCE 104 provides much higher transmission compared to the 15 nm Ag/Mg, semi-transparent metal film currently used in related art OLED displays.

A preferred candidate for the TCE material is indium tin oxide (ITO) nanoparticles (NPs) which can be solution processed to achieve a transparent film with good conductivity. In the present disclosure, various techniques can be used for solution processing. The techniques may include, but are not limited to, spin coating, blade coating, and inkjet printing. ITO NPs also have good resilience to a chemical etch process which enables the wire grid auxiliary electrode 108 to he deposited on top of the device.

While the related art device 100 illustrated in FIG. 1 enables a highly conductive electrode that is highly transparent, a disadvantage of the device is that there is an energy level mismatch between the ITO NPs and common ETLs of magnesium doped zinc oxide (MgZnO), aluminium doped zinc oxide (AlZnO), gallium doped zinc oxide (GaZnO) or zinc oxide (ZnO). This mismatch between the energy levels results in imperfect injection between the TCE and ETL layers and can result in reduced External Quantum Efficiencies (EQEs) and higher operating voltages.

FIG. 2A illustrates an energy level diagram for a related art QD-LED device 200. An ideal QLED device has good charge balance and aligned energy levels to enable high efficiency, low operating voltage and long lifetime. As illustrated in FIG. 2A, electrons flow from a cathode 202 to an EML 206 via an ETL 204. Holes flow from an anode 212 to the EML 206 via an HTL 208 and an HIL 210.

FIG. 2B illustrates an example of an energy level diagram for the improved related art device 100 illustrated in FIG. 1 that includes an ITO nanoparticle transparent electrode. The energy values shown are typical for the indicated types of materials but may vary based on the composition of the material (e.g., doping concentrations of the ETL) or the method of deposition. The energy diagram illustrates a relatively large energy jump between the ITO NP TCE 104 and the ETL 107 formed of $Mg_{0.1}Zn_{0.9}O$ (10% Mg concentration). The concentration of magnesium (or another dopant) may vary between 0-25%.

SUMMARY

The present disclosure is related to an ultrathin metal interlayer for improved injection into the electron transport layer.

In a first aspect of the present disclosure, a light-emitting device includes a first electrode, an electron transport layer (ETL), a second electrode being a transparent conductive electrode (TCE) including electrically conductive material, an emissive layer (EML) in electrical contact with the first electrode and the second electrode, and an ultrathin metal layer between the TCE and the ETL, wherein the ultrathin metal layer provides an energy step between the TCE and the ETL.

In an implementation of the first aspect, the ultrathin metal layer has a thickness between 1 nanometers and 5 nanometers.

In another implementation of the first aspect, the electrically conductive material comprises at least one of conductive nanoparticles, carbon nanotubes, silver nanowires, and PEDOT:PSS.

In yet another implementation of the first aspect, the conductive nanoparticles comprises indium tin oxide (ITO), aluminium zinc oxide (AZO), antimony tin oxide (ATO).

In yet another implementation of the first aspect, the ultrathin metal layer comprises a seed layer initially deposited on the ETL, and the seed layer comprises a metal oxide or a metal different from the ultrathin metal layer.

In yet another implementation of the first aspect, the seed layer comprises copper, aluminum, silver, germanium, gold, molybdenum oxide or tungsten oxide.

In yet another implementation of the first aspect, the ultrathin metal layer is an alloy of at least two metals.

In yet another implementation of the first aspect, the ultrathin metal layer comprises the at least two metals that are sputtered or thermally evaporated at the same time.

In yet another implementation of the first aspect, the light-emitting device further includes a substrate, a bottom reflector between the first electrode and the substrate, a hole injection layer (HIL), a hole transport layer (HTL), and a wire grid auxiliary electrode disposed on the second electrode, wherein the first electrode is disposed on the substrate between a viewing side of the light-emitting device and the substrate, the ETL is disposed between the first electrode and the viewing side, and the second electrode is disposed between the first electrode and the viewing side.

In yet another implementation of the first aspect, the bottom reflector comprises aluminum or silver, the wire grid auxiliary electrode comprises aluminum, copper, gold or silver, the first electrode is an anode comprising indium tin oxide (ITO), indium zinc oxide (IZO), aluminum or silver, the HIL comprises PEDOT:PSS, HIL8, molybdenum oxide ($MoO_3$) or tin oxide ($WO_3$), the HTL comprises TFB, PVK, poly-TPD, or OTPD, the EML includes quantum dots comprising cadmium selenide, indium phosphide or zinc selenide, the ETL comprises zinc oxide or metal doped zinc oxide, the second electrode is a nanoparticle transparent conductive electrode, and the nanoparticles are formed from ITO, indium zinc oxide, aluminium zinc oxide (AzO) or antimony tin oxide (ATO).

In yet another implementation of the first aspect, the HIL is disposed between the anode and the HTL, and the HTL is disposed between the HIL and the EML.

In yet another implementation of the first aspect, light is emitted away from the substrate.

In yet another implementation of the first aspect, the HIL is disposed between the HTL and the second electrode, and the HTL is disposed between the EML and the HIL.

In yet another implementation of the first aspect, an energy level of the ultrathin metal layer is between the energy levels of the TCE and the ETL.

In a second aspect of the present disclosure, a light-emitting device includes a substrate, a first electrode disposed on the substrate between a viewing side of the device and the substrate, a bottom reflector between the first electrode and the substrate, an electron transport layer (ETL) between the first electrode and the viewing side, a second electrode disposed between the ETL and the viewing side, wherein the second electrode includes electrically conductive nanoparticles, an emissive layer (EML) in electrical contact with the first electrode and the second electrode, and an ultrathin metal layer between the second electrode and the ETL, a hole injection layer (HIL), a hole transport layer (HTL), and a wire grid auxiliary electrode disposed on the second electrode, where an energy level of the ultrathin metal layer is between the energy levels of the nanoparticles and the ETL.

In an implementation of the second aspect, the ultrathin metal layer has a thickness between 1 nm and 5 nm.

In another implementation of the second aspect, the second electrode is a transparent conductive electrode (TCE) comprising at least one of conductive nanoparticles, carbon nanotubes, silver nanowires, and PEDOT:PSS.

In yet another implementation of the second aspect, the conductive nanoparticles comprises indium tin oxide (ITO), aluminium zinc oxide (AZO), antimony tin oxide (ATO).

In yet another implementation of the second aspect, the HIL is disposed between the anode and the HTL, and the HTL is disposed between the HIL and the EML. In yet another implementation of the second aspect, the HIL is disposed between the HTL and the second electrode, and the HTL is disposed between the EML, and the HIL.

BRIEF DESCRIPTION OF THE DRAWINGS

Aspects of the example disclosure are best understood from the following detailed description when read with the accompanying figures. Various features are not drawn to scale. Dimensions of various features may be arbitrarily increased or reduced for clarity of discussion.

DESCRIPTION

Figure 1:
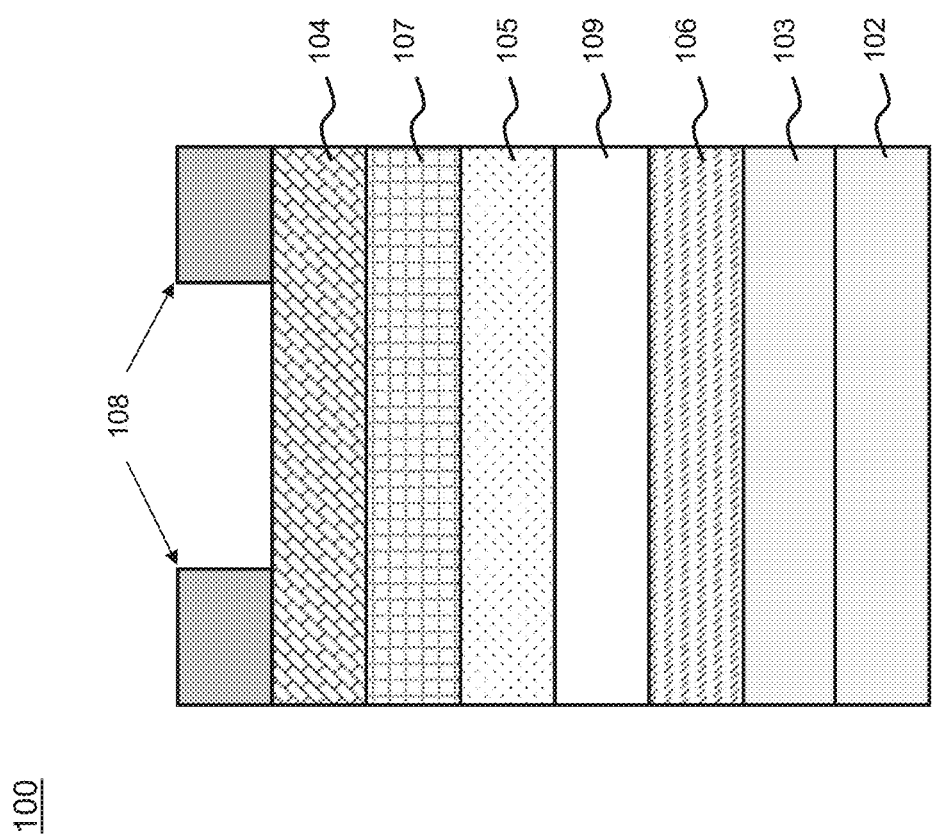
FIG. 1 illustrates an improved related art quantum dot (QD) light emitting diode (QD-LED) and possible materials for each element.
Figures 2A, 2B:
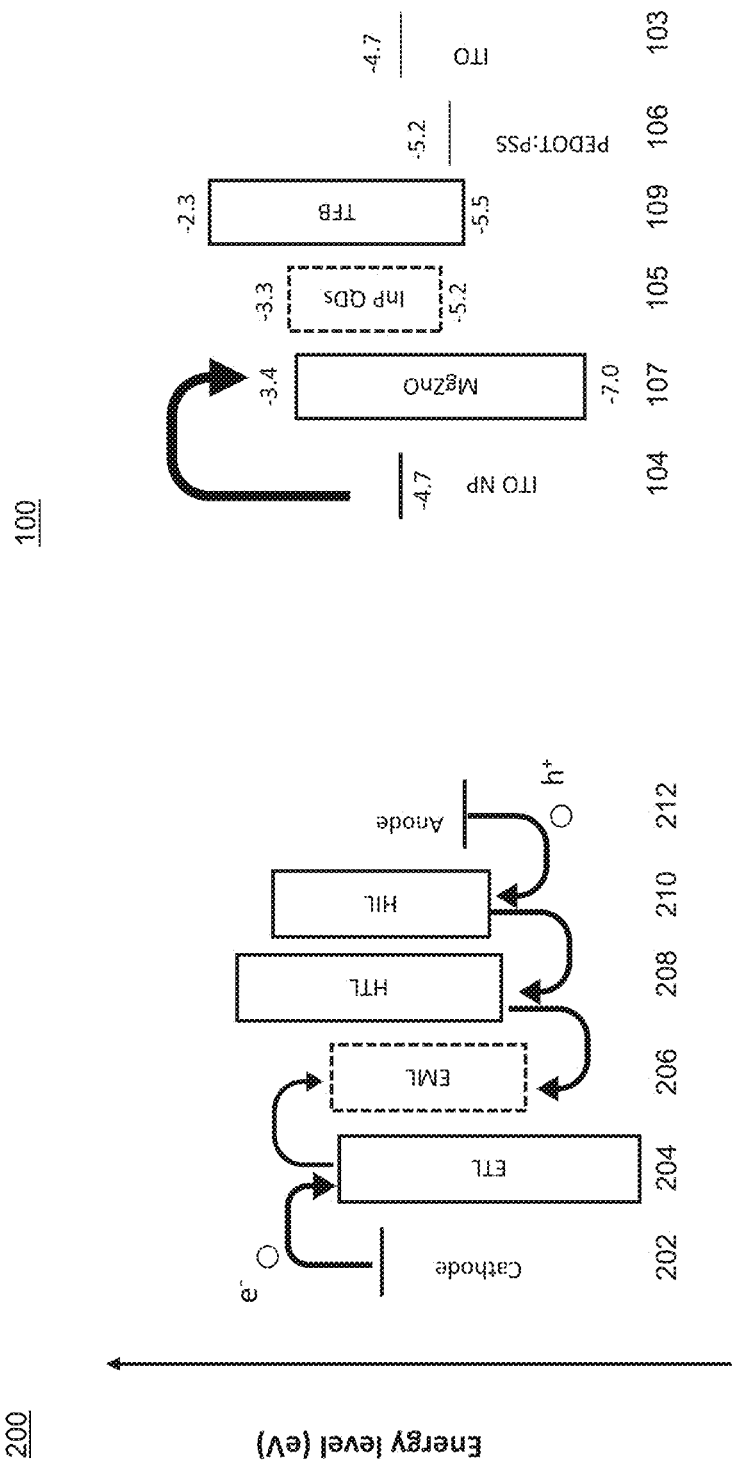
FIG. 2A illustrates an energy level diagram for a related art QD-LED device.
FIG. 2B illustrates an example of an energy level diagram for the improved related art device illustrated in FIG. 1.

The following description contains specific information pertaining to exemplary implementations in the present disclosure. The drawings and their accompanying detailed description are directed to exemplary implementations. However, the present disclosure is not limited to these exemplary implementations. Other variations and implementations of the present disclosure will occur to those skilled in the art. Unless noted otherwise, like or corresponding elements in the figures may be indicated by like or corresponding reference numerals. Moreover, the drawings and illustrations are generally not to scale and are not intended to correspond to actual relative dimensions.

For consistency and ease of understanding, like features are identified (although, in some examples, not shown) by numerals in the exemplary figures. However, the features in different implementations may be different in other respects, and therefore will not be narrowly confined to what is shown in the figures.

The phrases "in one implementation," and "in some implementations," may each refer to one or more of the same or different implementations. The term "coupled" is defined as connected, whether directly or indirectly via intervening components, and is not necessarily limited to physical connections. The term "comprising" means "including, but not necessarily limited to" and specifically indicates open-ended inclusion or membership in the described combination, group, series, and equivalents.

Additionally, any two or more of the following paragraphs, (sub)-bullets, points, actions, behaviors, terms, alternatives, examples, or claims described in the following disclosure may be combined logically, reasonably, and properly to form a specific method. Any sentence, paragraph, (sub)-bullet, point, action, behaviors, terms, or claims described in the following disclosure may be implemented independently and separately to form a specific method. Dependency, e.g., "according to", "more specifically", "preferably", "In one embodiment", "In one implementation", "In one alternative" etc., in the following disclosure refers to just one possible example which would not restrict the specific method.

For explanation and non-limitation, specific details, such as functional entities, techniques, protocols, and standards are set forth for providing an understanding of the described technology. In other examples, detailed description of well-known methods, technologies, system, and architectures are omitted so as not to obscure the description with unnecessary details.

Figure 3:
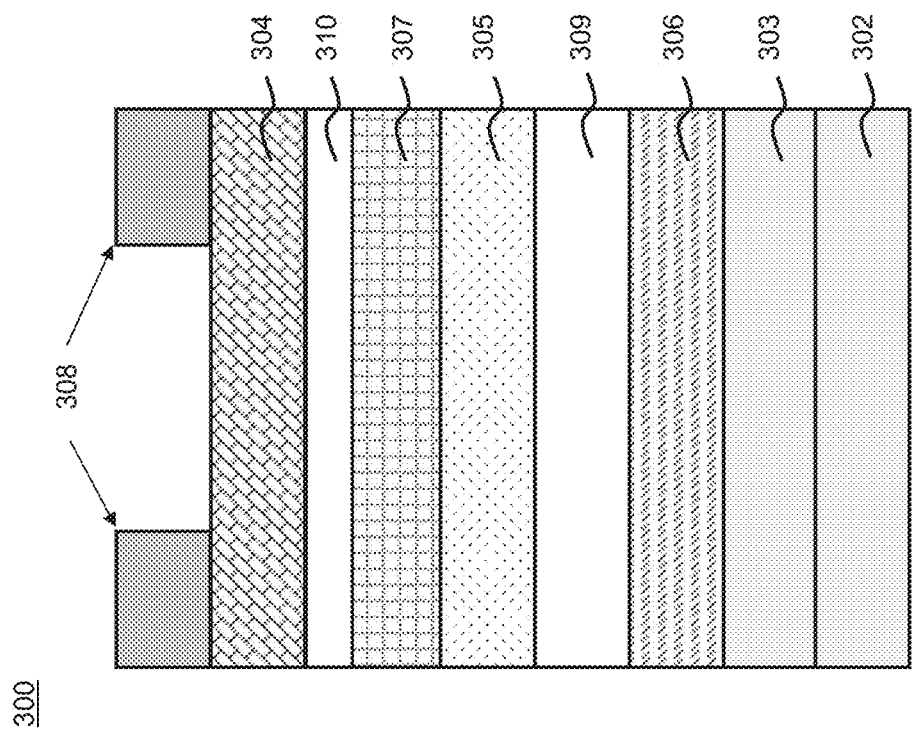
FIG. 3 illustrates a "standard" structure of a QLED device in accordance with an example implementation of the present disclosure.
Figure 4:
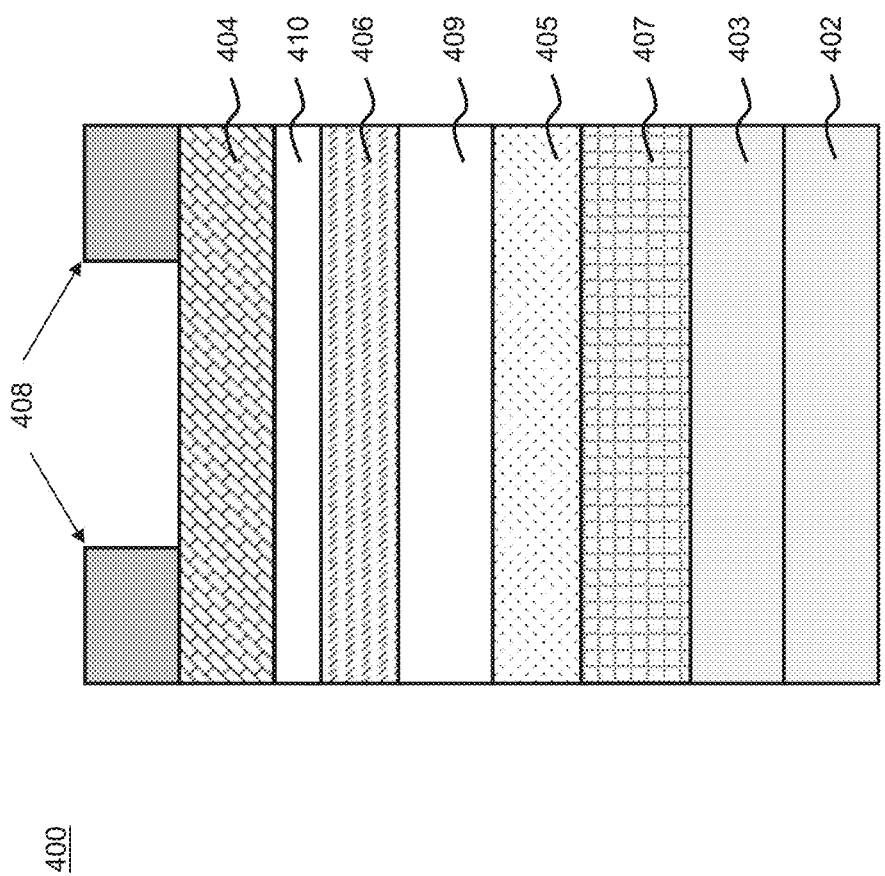
FIG. 4 illustrates an "inverted" structure of the QLED device in accordance with an example implementation of the present disclosure.

FIG. 3 illustrates a "standard" structure of a QLED device 300 in accordance with an example implementation of the present disclosure. FIG. 4 illustrates an "inverted" structure of the QLED device 400 in accordance with an example implementation of the present disclosure.

The "standard" structure of the QLED device 300 in FIG. 3 includes a bottom reflector 302, an anode 303, an HIL 306, an HTL 309, an EML 305 including quantum dots (QDs), an ETL 307, a TCE 304 including a conductive nanoparticle layer in combination with a wire grid auxiliary electrode 308. In order to improve injection from the conductive nanoparticle layer of the TCE 304, an ultrathin metal layer 310 is deposited between the conductive nanoparticle layer of the TCE 304 and the ETL 307. The ultrathin metal layer 310 has a work function ($\varphi$) value between the energy levels of the TCE 304 and the ETL 307 such the energy gap is split into 2 steps.

The "inverted" structure of the QLED device 400 in FIG. 4 includes a bottom reflector 402, a cathode 403, an ETL 407, an EML 405 including quantum dots (QDs), an HTL 409, an HIL 406, and a TCE 404 including a conductive nanoparticle layer in combination with a wire grid auxiliary electrode 408. In order to improve injection from the conductive nanoparticle layer of the TCE 404, an ultrathin metal layer 410 is deposited between the conductive nanoparticle layer of the TCE 404 and the HIL 406. The ultrathin metal layer 410 has a work function ($\varphi$) value between the energy levels of the TCE 404 and the HIL 406 such the energy gap is split into 2 steps.

Figure 5:
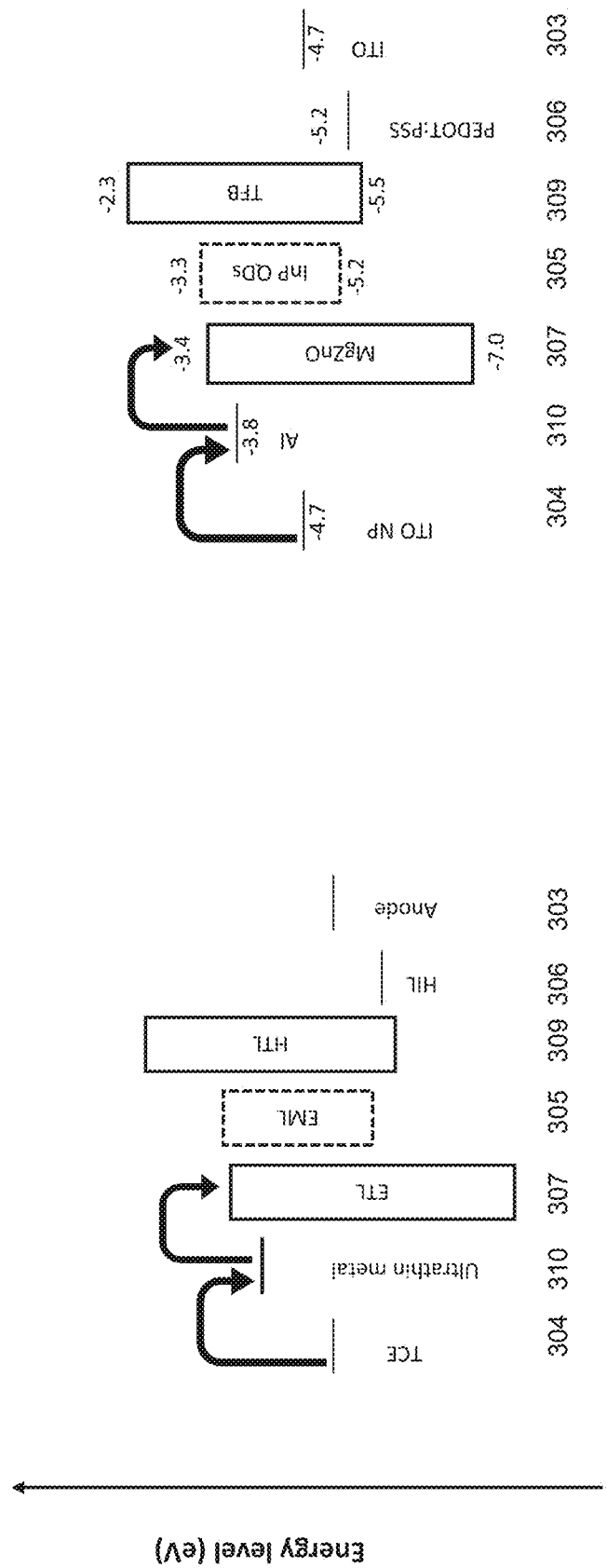
FIG. 5A illustrates a general energy diagram for the QLED device in accordance with an example implementation of the present disclosure.
FIG. 5B illustrates a specific example of the QLED device in accordance with an example implementation of the present disclosure with possible materials and corresponding energy levels.

FIG. 5A illustrates a general energy diagram for the QLED device 300 in accordance with an example implementation of the present disclosure. The QLED device 300 in FIG. 5A has an NP TCE 304 and an ultrathin metal layer 310 between the TCE 304 and the ETL 307. The TCE 304 is a transparent conductive material such as indium tin oxide nanoparticles. FIG. 5B illustrates a specific example of the QLED device 300 in accordance with an example implementation of the present disclosure with possible materials and corresponding energy levels. For an ETL 307 of a MgZnO, which has an energy level around −3.4 eV, and a TCE 304 of ITO NP, which has an energy level around −4.7 eV, metals such as silver (−4.2>$\varphi$>−4.6) and aluminium (−3.8>$\varphi$>−4.1) are both suitable interlayers for the ultrathin metal layer 310 enabling an energy step between the TCE 304 and ETL 307.

The ultrathin metal layer 310 must be optically thin such that it does not significantly counter the high transparency of the TCE 304. For several metals, a film thickness <5 nm has a transparency over 70%. The thinner the ultrathin metal layer 310, the higher its transparency. As the ultra thin metal layer 310 functions as an interface between the TCE 304 and the ETL 307, it may be important for the ultrathin metal layer 310 to have an adequate thickness to ensure continuity across the interface so that its effect of the energy barrier step can be realized. In some implementations of the present disclosure, it is desirable that the ultrathin metal layer 310 has a thickness between 1 nm and 5 nm.

The ultrathin metal layer 310 can be challenging to deposit uniformly due to a phenomenon called islanding or Volmer-Weber mode that is undesirable since it can lead to non-uniform performance between pixels of a display. Methods of ensuring uniform deposition of the ultrathin metal layer 310 have been demonstrated (i.e., Yan-Gang Bi el al. 2019) and include using a seed layer such as 1 nm of another metal, using a seed layer such as 1 nm of a metal oxide and depositing the metal layer in combination with a second metal which involves sputtering or thermally evaporating two different metals at the same time such that the ultrathin metal layer is an alloy.

In an embodiment of the present disclosure, the ultrathin metal layer 310 has a thickness of less than or equal to 5 nm.

In another embodiment of the present disclosure, the ultrathin metal layer 310 is a metal with a work function ($\varphi$) having an energy value between the energy value of the TCE 304 and ETL 307. If the ETL 307 is formed of MgZnO ($\varphi \approx -3.4$ eV) and the TCE 304 is formed of ITO nanoparticles ($\varphi \approx -4.7$ eV) then some appropriate metals for the ultrathin metal layer 310 with corresponding energy levels are indicated in Table 1 as follows:

TABLE 1

| Metal | W.F. (eV) |
|---|---|
| Ag | −4.3 |
| Mo | −4.4 |
| Sn | −4.4 |
| Ti | −4.3 |
| Al | −3.8 |
| Mn | −4.1 |
| In | −4.1 |
| Mg | −3.7 |
| Zn | −3.6 |

It is noted that N.B. −4.7 eV is work function for bulk ITO. Actual energy level/work function for ITO NP film may be slightly different.

In a further embodiment of the present disclosure, the ultrathin metal layer 310 includes a seed layer deposited initially on the ETL 307. The seed layer may be <1.5 nm of another metal such as copper, aluminium, silver, germanium or gold or <1.5 nm of a metal oxide such as molybdenum oxide or tungsten oxide.

In a further embodiment of the present disclosure, the ultrathin metal layer 310 is an alloy of at least two metals. For example, silver and aluminium can be deposited at the same time via sputtering or thermal evaporation.

For devices according to the present disclosure, the following materials may be utilized:

The bottom reflector 302 may be aluminum or silver.

The anode 303 may be indium tin oxide (ITO), indium zinc oxide (IZO), aluminium or silver.

The HIL 306 may be PEDOT:PSS, HIL8, molybdenum oxide ($MoO_3$) or tin oxide ($WO_3$).

The HIT 309 may be TFB, PVK, poly-TPD, or OTPD.

The QDs in the EML 305 may have a core comprising cadmium selenide, indium phosphide or zinc selenide.

The ETL 307 may be zinc oxide or metal doped zinc oxide.

The TCE 304 may be formed of conductive nanoparticles such as indium tin oxide (ITO), aluminium zinc oxide (AZO), antimony tin oxide (ATO). Alternatively, the TCE 304 may include carbon nanotubes, silver nanowires or PEDOT:PSS. In some implementations, the TCE 304 may be any blend of the above material. In some further implementations, the TCE 304 may comprise sputtered The wire grid auxiliary electrode 308 may be aluminum, copper, gold or silver.

Figure 6:
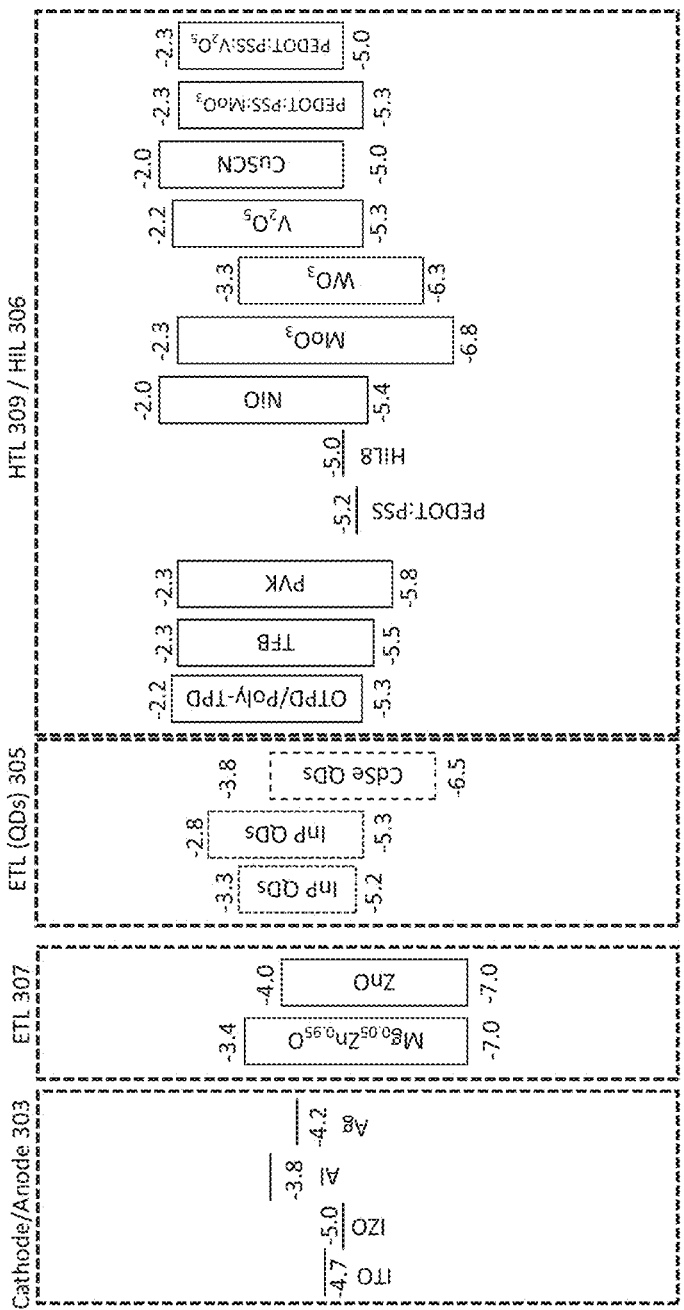
FIG. 6 illustrates possible materials for the various elements of the QLED device in accordance with an example implementation of the present disclosure with possible materials and corresponding energy levels.

FIG. 6 illustrates possible materials for the various elements of the QLED device in accordance with an example implementation of the present disclosure with possible materials and corresponding energy levels.

From the previous disclosure, it is evident that various techniques can be utilized for implementing the concepts of the present. disclosure without departing from the scope of those concepts. Moreover, while the concepts have been described with specific reference to certain implementations, a person of ordinary skill in the art would recognize that changes can be made in form and detail without departing from the scope of those concepts. As such, the disclosure is to be considered in all respects as illustrative and not restrictive. It should also be understood that the present disclosure is not limited to the particular described implementations, but that many rearrangements, modifications, and substitutions are possible without departing from the scope of the present disclosure.

What is claimed is:

1. A light-emitting device comprising:
   a first electrode;
   an electron transport layer (ETL);
   a second electrode being a transparent conductive electrode (TCE) including electrically conductive material;
   an emissive layer (EML) in electrical contact with the first electrode and the second electrode; and
   an ultrathin metal layer between the TCE and the ETL, wherein the ultrathin metal layer provides an energy step between the TCE and the ETL.

2. The light-emitting device of claim 1, wherein the ultrathin metal layer has a thickness between 1 nanometers and 5 nanometers.

3. The light-emitting device of claim 1, wherein the electrically conductive material comprises at least one of conductive nanoparticles, carbon nanotubes, silver nanowires, and PEDOT:PSS.

4. The light-emitting device of claim 3, wherein the conductive nanoparticles comprises indium tin oxide (ITO), aluminium zinc oxide (AZO), antimony tin oxide (ATO).

5. The light-emitting device of claim 1, wherein:
   the ultrathin metal layer comprises a seed layer initially deposited on the ETL;
   the seed layer comprises a metal oxide or a metal different from the ultrathin metal layer.

6. The light-emitting device of claim 5, wherein the seed layer comprises copper, aluminum, silver, germanium, gold, molybdenum oxide or tungsten oxide.

7. The light-emitting device of claim 1, wherein the ultrathin metal layer is an alloy of at least two metals.

8. The light-emitting device of claim 7, wherein the ultrathin metal layer comprises the at least two metals that are sputtered or thermally evaporated at the same time.

9. The light-emitting device of claim 1, further comprising:
   a substrate;
   a bottom reflector between the first electrode and the substrate;
   a hole injection layer (HIL);
   a hole transport layer (HTL); and
   a wire grid auxiliary electrode disposed on the second electrode,
   wherein:
   the first electrode is disposed on the substrate between a viewing side of the light-emitting device and the substrate;
   the ETL is disposed between the first electrode and the viewing side; and
   the second electrode is disposed between the first electrode and the viewing side.

10. The light-emitting device of claim 9, wherein:
    the bottom reflector comprises aluminum or silver;
    the wire grid auxiliary electrode comprises aluminum, copper, gold or silver;
    the first electrode is an anode comprising indium tin oxide (ITO), indium zinc oxide (IZO), aluminum or silver;
    the HIL comprises PEDOT:PSS, HIL8, molybdenum oxide ($MoO_3$) or tin oxide ($WO_3$);
    the HTL comprises TFB, PVK, poly-TPD, or OTPD;
    the EML includes quantum dots comprising cadium selenide, indium phosphide or zinc selenide;
    the ETL comprises zinc oxide or metal doped zinc oxide;
    the second electrode is a nanoparticle transparent conductive electrode; and
    the nanoparticles are formed from ITO, indium zinc oxide, aluminium zinc oxide (AzO) or antimony tin oxide (ATO).

11. The light-emitting device of claim 9, wherein:
    the HIL is disposed between the anode and the HTL; and
    the HTL is disposed between the HIL and the EML.

12. The light-emitting device of claim 11, wherein light is emitted away from the substrate.

13. The light emitting device of claim 9, wherein:
    the HIL is disposed between the HTL and the second electrode; and
    the HTL is disposed between the EML and the HIL.

14. The light-emitting device of claim 1, wherein an energy level of the ultrathin metal layer is between the energy levels of the TCE and the ETL.

15. A light-emitting device comprising:
a substrate;
a first electrode disposed on the substrate between a viewing side of the device and the substrate;
a bottom reflector between the first electrode and the substrate;
an electron transport layer (ETL) between the first electrode and the viewing side;
a second electrode disposed between the ETL and the viewing side, wherein the second electrode includes electrically conductive nanoparticles;
an emissive layer (EML) in electrical contact with the first electrode and the second electrode;
an ultrathin metal layer between the second electrode and the ETL;
a hole injection layer (HIL);
a hole transport layer (HTL); and
a wire grid auxiliary electrode disposed on the second electrode,
wherein an energy level of the ultrathin metal layer is between the energy levels of the nanoparticles and the ETL.

16. The light-emitting device of claim 15, wherein the ultrathin metal layer has a thickness between 1 nanometers and 5 nanometers.

17. The light-emitting device of claim 15, wherein the second electrode is a transparent conductive electrode (TCE) comprising at least one of conductive nanoparticles, carbon nanotubes, silver nanowires, and PEDOT:PSS.

18. The light-emitting device of claim 17, wherein the conductive nanoparticles comprises indium tin oxide (ITO), aluminium zinc oxide (AZO), antimony tin oxide (ATO).

19. The light-emitting device of claim 15, wherein:
the HIL is disposed between the anode and the HTL; and
the HTL is disposed between the HIL and the EML.

20. The light-emitting device of claim 15, wherein:
the HIL is disposed between the HTL and the second electrode; and
the HTL is disposed between the EML and the HIL.

* * * * *